(12) United States Patent  
Froment

(10) Patent No.: US 6,366,098 B1
(45) Date of Patent: Apr. 2, 2002

(54) TEST STRUCTURE, INTEGRATED CIRCUIT, AND TEST METHOD

(75) Inventor: Benoît Froment, Crolles (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/336,269

(22) Filed: Jun. 18, 1999

(30) Foreign Application Priority Data

Jun. 19, 1998 (FR) .............................................. 9807788

(51) Int. Cl.⁷ .......................... G01N 27/22; G01R 27/26
(52) U.S. Cl. ...................... 324/678; 324/537; 324/658; 324/158.1
(58) Field of Search ................................ 324/537, 763, 324/765, 658, 678, 679, 158.1

(56) References Cited

U.S. PATENT DOCUMENTS 5,519,327 A * 5/1996 Consiglio ................... 324/678
5,576,628 A * 11/1996 Caliboso et al. ............ 324/678

OTHER PUBLICATIONS

Chen J C et al: "An on–chip, interconnect capacitance characterization method with sub–femto–farad resolution"; IEEE Transactions on Semiconductor Manufacturing, May 1998, IEEE, USA, vol. 11, No. 2, pp. 204–210, XP002096116.

Dae–hyung Cho et al.: "Measurement and characterization of multi–layered interconnect capacitance for deep submicron VLSI technology"; Mar. 1997 IEEE International Conference on Microelectronic Test Structures Proceedings, Monterey, CA, USA, Mar. 17–20, 1997, pp. 91–94, XP002096117.

* cited by examiner

Primary Examiner—Glenn W. Brown
(74) Attorney, Agent, or Firm—Lisa K. Jorgenson; Stephen Bongini; Fleit, Kain, Gibbons, Gutman & Bongini P.L.

(57) ABSTRACT

A test structure includes a single current-measuring means for measuring current between a supply terminal and ground, and first and second branches for measuring capacitance between first and second metal lines. The first branch includes a first switch coupled between the current-measuring means and the first line, and a second switch coupled between the first line and ground. Similarly, the second branch includes a third switch coupled between the current-measuring means and the second line, and a fourth switch coupled between the second line and ground. A method for testing a circuit is also provided. According to the method, the capacitance between first and second metal lines is calculated by: measuring a first current needed to bring the first line to the voltage of a first terminal while the other lines are at the voltage of a second terminal, measuring a second current needed to bring the second line to the voltage of the first terminal while the other lines are at the voltage of the second terminal, and measuring a third current needed to bring the first and second lines to the voltage of the first terminal while the other lines are at the voltage of the second terminal. The measurements are performed using a single current-measuring means.

9 Claims, 7 Drawing Sheets

TEST STRUCTURE, INTEGRATED CIRCUIT, AND TEST METHOD

CROSS-REFERENCE TO RELATED APPLICATIONS

This application is based upon and claims priority from prior French Patent Application No. 98-07788, filed Jun. 19, 1998, the entire disclosure of which is herein incorporated by reference.

BACKGROUND OF THE INVENTION

1. Field of the Invention

The present invention relates to electronic circuits, and more specifically to circuits having a stack of alternating dielectric and conducting layers arranged on a substrate.

2. Description of Related Art

It has been found that it is necessary to ascertain the various capacitances existing between various lines of an integrated circuit (e.g., between two intersecting or parallel superposed lines or between two parallel lines in the same metallization plane). By knowing these capacitances it becomes possible to deduce the thickness of the dielectric that is arranged between the two metallized lines, and thus to monitor the process by which the integrated circuit is fabricated.

The article entitled "Measurement and Characterization of Multi-Layered Interconnect Capacitance for Deep Submicron VLSI Technology" (Proc. IEEE 1997 Int. Conference on Microelectronic Test Structures, Vol. 10, March 1997) discloses a structure for testing capacitances in an integrated circuit. The test structure includes two similar branches that are arranged between a supply terminal and ground, and each of the branches has a means for measuring current such as an NMOS transistor and a PMOS transistor arranged in series. A first portion of a first metallized line is connected to a common point between two transistors of one branch, and a second portion of the first metallized line is similarly connected to the other branch to measure the capacitance existing between the second portion of the first line and another line. The other metallized line is grounded.

In this circuit, $C_{10}$ denotes the capacitance between the first portion and ground, $C_{20}$ the capacitance between the second portion and ground, $C_{23}$ the capacitance between the second portion and the other metallized line, $C_{strayl}$ the stray capacitance of the first branch (due to the transistors), and $C_{strayr}$ the stray capacitance of the second branch. The MOS transistors of the two branches are driven by voltage signals such that no short circuit can occur (i.e., so that the two transistors of one branch are never on at the same time). The gates of the two PMOS transistors are connected together, and the gates of the two NMOS transistors are also connected together. The current-measuring means measures the average value of the currents.

The article entitled "An on-chip, interconnect capacitance characterization method with sub-femto-farad resolution" by Chen, Sylvester, and Hu (IEEE Transactions on Semiconductor Manufacturing, Vol. 11, May 2, 1998) is similar to the article mentioned above, but proposes the use of the same current-measuring means for both of the branches. The difference between these average values is due to the charge of the capacitance that is to be measured, as given by the following equation.

$$\Delta I = C \times Vdd \times f$$

The capacitance can be deduced from this equation. However, in this structure, the superposition theorem does not apply so the capacitance $C_{23}$ cannot be obtained. When the difference $\Delta I$ between the currents in the two branches is taken, the following equation is obtained.

$$\Delta I = (C_{23} + C_{10} - C_{20} + C_{strayr} - C_{strayl}) Vdd \times f$$

The superposition theorem does not apply because the capacitance $C_{20}$ is not the same as $C_{10}$ because of the presence of the metal of the third line that modifies the distribution of the field lines. Thus, this method does not make it possible to extract the term $C_{23}$. Instead, all that is obtained is a sum of capacitances, which has no physical meaning and which cannot readily be utilized. When the number of metal lines increases, this sum contains additional terms and becomes unusable. Further, differences exist between the transistors of the two branches, and in particular in the drain junctions. It has actually been found that this difference can amount to a value on the order of 1 to 10%, which is difficult to measure. There may also be a discrepancy between the dimensions of the two capacitances that charge the structure. In the structure of FIG. 1 of the above-mentioned article, the metal lines 1 are supposed to be similar. However, this is only true to within the technological tolerances.

SUMMARY OF THE INVENTION

In view of these drawbacks, it is an object of the present invention to overcome the above-mentioned drawbacks and to provide a test structure having improved accuracy.

Another object of the present invention is to provide a test structure that makes it possible to measure the capacitances and overcome the problems associated with the different stray capacitances and possibilities of differences existing between the transistors of the various branches. This allows the superposition theorem to be used to deduce the values of the capacitances.

One embodiment of the present invention provides a test structure for testing a circuit of the type having a plurality of metallization planes separated by dielectric layers. The test structure includes a single current-measuring means for measuring current between a supply terminal and ground, and first and second branches for measuring capacitance between first and second metal lines. The first branch includes a first switch coupled between the current-measuring means and the first line, and a second switch coupled between the first line and ground. Similarly, the second branch includes a third switch coupled between the current-measuring means and the second line, and a fourth switch coupled between the second line and ground. In a preferred embodiment, the test structure also includes an additional branch, which is not connected to any line, for measuring stray capacitance of the switches.

Another embodiment of the present invention provides an integrated circuit that includes at least one dielectric layer, at least two metallization planes separated by the dielectric layer, and at least one test structure coupled between two terminals. The test structure includes a single current-measuring means for measuring current between the two terminals, and at least two branches for measuring the capacitance between at least two of the metal lines. Further, each of the branches includes a switch that is coupled between the current-measuring means and one of the terminals. In one preferred embodiment, each of the branches also includes another switch that is coupled between one of the lines and the one terminal.

Yet another embodiment of the present invention provides a method for testing a circuit of the type having a plurality of metallization planes separated by dielectric layers. According to the method, the capacitance between a first metal line and a second metal line is calculated by: measuring a first current that is needed to bring the first line to the voltage of a first terminal while the other lines are kept at the voltage of a second terminal, measuring a second current that is needed to bring the second line to the voltage of the first terminal while the other lines are kept at the voltage of the second terminal, and measuring a third current that is needed to bring the first and second lines to the voltage of the first terminal while the other lines are kept at the voltage of the second terminal. The measurements are performed using a single current-measuring means, and a branch having two switches in series is associated with each of the lines.

Yet another embodiment of the present invention allows calculation of other values. The height of the metal forming one of the metal lines is calculated by measuring the resistance $R_1$ between two points of a portion with theoretical width $W_1$, the resistance $R_2$ between two points of another line portion with theoretical width $W_2$, which is different from $W_1$, the real width of a line portion differing from the theoretical width by a constant difference $\Delta W$ regardless of the theoretical width, and by eliminating the unknown term $\Delta W$ from the equations: $R_1 = \rho \times L_1 / H/(W_1 = \Delta W)$ and $R_2 = \rho \times L_2 + \Delta W)$, with p being the known resistance constant in ohm/meter associated with metal used and L being the length of the portion in question, to give $H = \rho \times (L_2/R_2 - L_1/R_1)/(W_2 - W_1)$. The thickness d of the dielectric separating the line from an adjacent line is calculated by using $d = \epsilon \times L_1 \times H / C_1$, $\epsilon$ being permittivity of the material of the dielectric layer and $C_1$ being the capacitance between the first line portion and the neighboring line from which the first portion is separated by the thickness e of the dielectric. The fabrication pitch p of the lines is calculated using $p = W_1 + \Delta W + d$ and $\Delta W = \rho \times L_1 / H/R - W_2$.

Still another embodiment of the present invention allows calculation of further values. A capacitance $C_1$ between the two metal line portions with length L and width $W_1$ in two adjacent metallization planes is measured, with the measured capacitance being equal to $C_1 = \epsilon \times L \times W_1 / e + C_{edge}$, with $C_{edge}$ being due to edge effects that are constant regardless of the width of the line portion. A capacitance $C_2$ between two line portions with the same length L, but with width $W_2$, which is different from $W_1$ and in the same metallization plane, is measured, the measured capacitance being equal to $C_2 = \epsilon \times L \times W_2 / e + C_{edge}$. Subtraction is used to eliminate the term $C_{edge}$ and give $C_1 - C_2 = \epsilon \times L \times (W_1 - W_2)/e$, and the value of the thickness e of the dielectric layer separating two adjacent metallization planes is deduced using $e = \epsilon \times L \times (W_1 - W_2)/(C_1 - C_2)$.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 1:
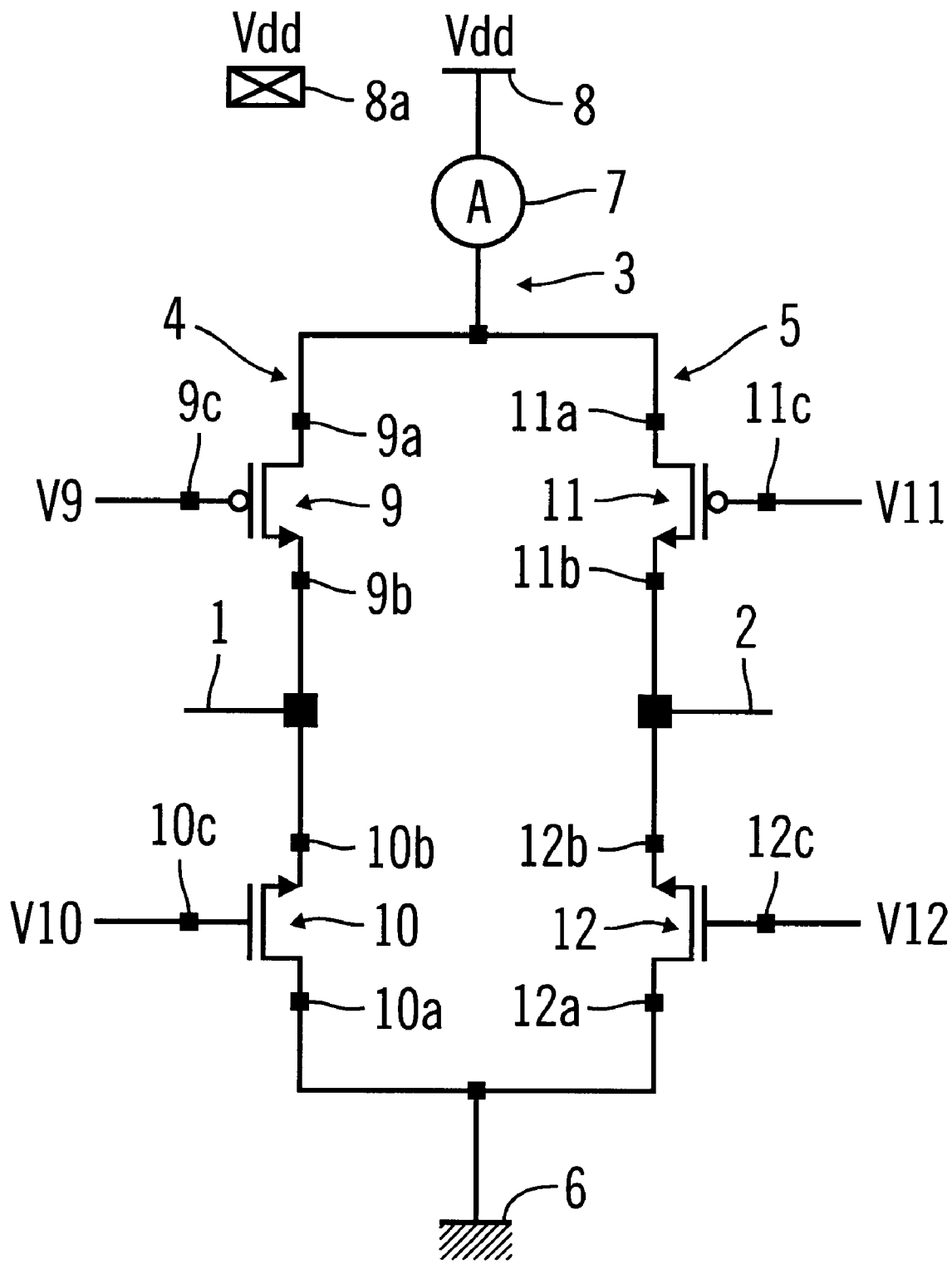
FIG. 1 is a diagram of a test structure according to a first embodiment of the present invention.

A test structure according to a first embodiment of the present invention is shown in FIG. 1. Two metal lines 1 and 2 of an integrated circuit (not shown) are connected to the test structure 3. The relative arrangement of the metal lines 1 and 2 is arbitrary in the figure. It is possible to measure the capacitance between two metal lines irrespective of their relative arrangement (e.g., superposed parallel, superposed intersecting, or parallel in the same metallization plane). The test structure 3 includes two branches 4 and 5 arranged in parallel that are connected on one side to ground 6 and on the opposite side to a means 7 for measuring current (e.g., an ammeter), which is connected to a supply terminal 8 that can deliver a DC voltage Vdd. A terminal 8a is also provided for biasing the N well of the PMOS transistors with the voltage Vdd. The supply includes a generator of non-overlapping signals to which an input signal of the square-wave type is delivered.

The first branch 4 has two MOS transistors arranged in series between the current-measuring means 7 and ground 6. In particular, a first transistor 9 of the PMOS type has its drain 9a connected to the current-measuring means 7 and its source 9b connected to the first line 1, and a second transistor 10 of the NMOS type has its drain 10a connected to ground 6 and its source 10b connected to the first line 1 and the source 9b of the PMOS transistor 9. The second branch 5 is of similar design to the first branch 4 and has a PMOS transistor 11 and an NMOS transistor 12 arranged in series and with their common point connected to the second line 2. The gates 9c, 10c, 11c, and 12c of the transistors 9 through 12 are independent of one another and driven by supply voltages V9 through V12. The transistors 9 through 12 and their connections are integrated into the circuit (e.g., in cutting paths).

Figure 2:
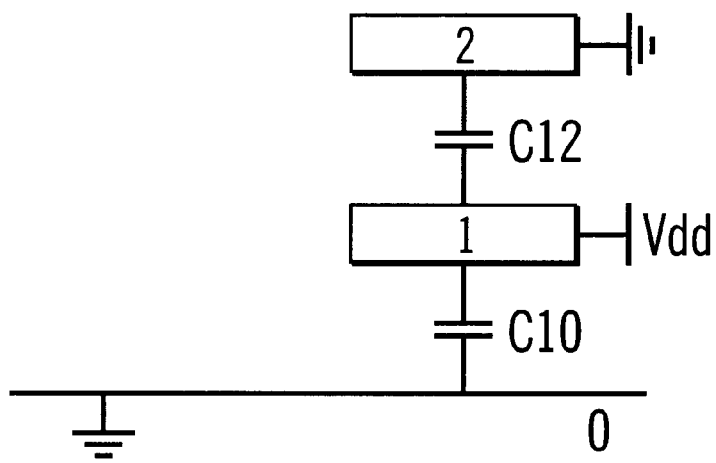
FIGS. 2 through 4 are diagrams demonstrating the use of the test structure of FIG. 1.
Figure 3:
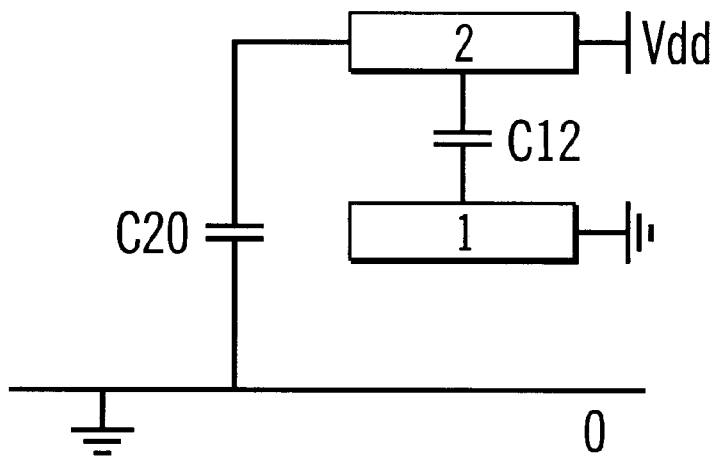
Figure 4:
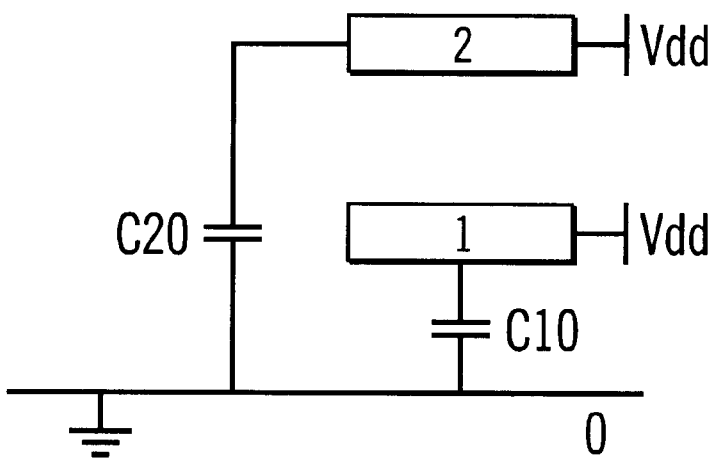

The test structure 3 can be used in the manner demonstrated in FIGS. 2 through 4. FIG. 2 shows the first line 1 having the voltage Vdd applied to it and the second line 2 being grounded. This is done by turning transistors 9 and 12 on and turning transistors 10 and 11 off using suitable drive voltages. More specifically, transistor 9 is turned on using a zero voltage for V9, transistor 10 is turned off using a zero voltage for V10, transistor 11 is turned off using a voltage V11 equal to Vdd, and transistor 12 is turned on using a voltage V12 equal to Vdd. In this state, the current needed to charge the first line 1 under the voltage Vdd satisfies the following equation.

$$I1 = (C_{12} + C_{10} + C_{stray4}) \times Vdd \times f$$

where f is the operating frequency of the test structure, $C_{12}$ is the capacitance between the two branches 1 and 2, $C_{10}$ is the capacitance between the first branch 1 and ground 6, and $C_{stray4}$ represents the stray capacitances of the first branch 4 of the test structure 3 (in particular due to the switches 9 and 10 and to the capacitances $C_{10}$ and $C_{12}$).

As shown in FIG. 3, another measurement is taken with the first line 1 under zero voltage and the second line 2 under the voltage Vdd, in a similar way to the measurement taken in the case of FIG. 2. In particular, transistors 9 and 12 are turned off and transistors 10 and 11 are turned on using suitable drive signals V9 through V12. The current needed to charge the second branch 2 under the voltage Vdd is given as follows.

$$I2=(C_{12}+C_{20}+C_{stray5})\times Vdd\times f$$

where $C_{20}$ is the capacitance between the second branch 2 and ground 6, and $C_{stray5}$ represents the stray capacitances of the second branch 5.

Further, as shown in FIG. 4, another measurement of the current needed to charge the two lines 1 and 2 under a voltage Vdd is taken. This current satisfies the following equation.

$$I3=(C_{10}+C_{20}+C_{stray4}+C_{stray5})\times Vdd\times f$$

The capacitance $C_{12}$ between the lines 1 and 2 is no longer involved because they receive the same voltage Vdd, which is obtained by turning transistors 10 and 12 off and turning transistors 9 and 11 on. The voltage of $C_2$ can then be deduced as follows.

$$C_{12}=\frac{I1+I2-I3}{2\times Vdd\times f}$$

Thus, the test method described above avoids the influence of the stray capacitances of each branch on the measurement of the capacitance between the two lines that is to be measured.

More precisely, the charging current of line 1 can be written as follows.

$$I_1=(C_{12}+C_{10}+C_{stray4}(C_{12}\cdot C_{10}))\times Vdd\times f$$

Similarly:

$$I_2=(C_{12}+C_{20}+C_{stray5}(C_{12}\cdot C_{20}))\times Vdd\times f$$

$$I_3=(C_{10}+C_{20}+C_{stray4}(C_{10})+C_{Stray5}(C_{20}))\times Vdd\times f$$

Because the stray capacitances depend on the line capacitances $C_{10}$, $C_{20}$, and $C_{12}$, this gives the following.

$$C_{12}=\frac{I_1+I_2-I_3}{2\times Vdd\times f}+1/2(C_{stray4}(C_{12}-C_{10})+C_{stray5}(C_{12}\cdot C_{20})-C_{stray4}(C_{10})-C_{stray5}(C_{20}))$$

In order to minimize the effect of the stray capacitances, it is necessary for the charges seen by the charging transistors 9 and 11 to all be substantially equal. This condition is satisfied if:

$$C_{stray4}(C_{12}\cdot C_{10})=C_{stray4}(C_{10}) \text{ and}$$

$$C_{stray5}(C_{12}\cdot C_{20})=C_{stray5}(C_{20}),$$

or if $C_{12}$ is very much less than $C_{20}$ and $C_{10}$. In order to balance the system by avoiding any non-linearities that can arise, $C_{10}$ is preferably chosen to be very close to $C_{20}\cdot C_{10}$, and $C_{20}$ can be increased using additional capacitors arranged in the test structure on either side of the lines 1 and 2 so that $C_{12}$ is not modified by the stray capacitances. This allows excellent resolution that can be as good as 0.3 aF to be obtained.

Figure 5:
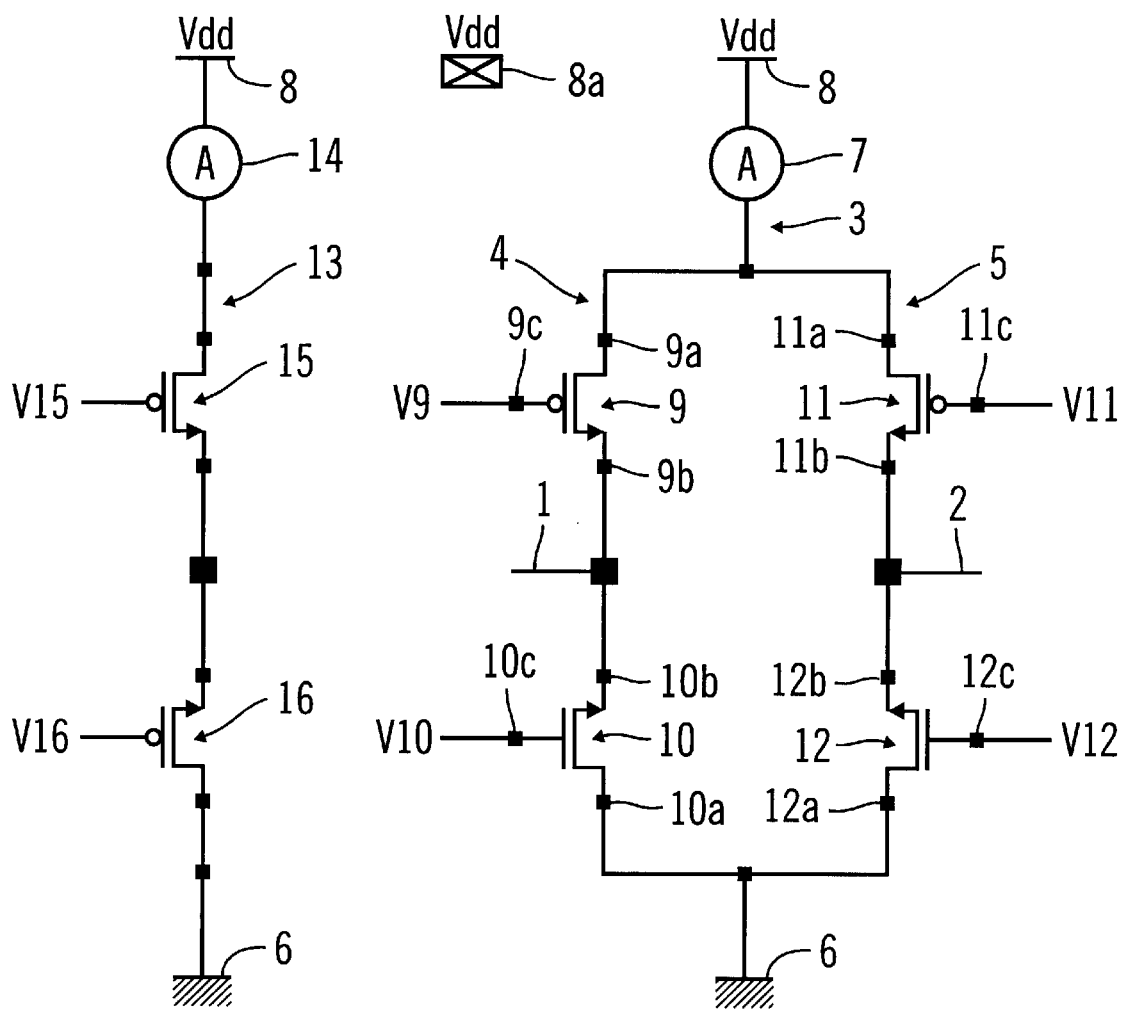
FIG. 5 is a diagram of a test structure according to a second embodiment of the present invention.

If it is also desired to obtain the value of the capacitances $C_{10}$ and $C_{20}$, the test structure illustrated in FIG. 5 can be used. This test structure corresponds to the test structure of FIG. 1 supplemented by an additional branch 13 that is also connected to the supply terminal 8 and ground 6. The additional branch 13 has a current-measuring means 14, a PMOS transistor 15, and an NMOS transistor 16, arranged in series with the common point between the transistors 15 and 16 not being connected to a metallized line. Thus, it is possible to estimate the value of the stray capacitances of the additional branch 13 by taking the same measurements as for the first and second branches 4 and 5, by which the current needed to obtain the voltage Vdd of the common point between the transistors 15 and 16 is measured. This current I4 satisfies the following equation.

$$I4=C_{stray}\times Vdd\times f$$

$C_{stray}$ representing the stray capacitances of the additional branch 13.

From the knowledge of the value of the capacitance $C_{12}$, the value of the capacitance $C_{10}$ is given by the following equation.

$$C_{10}=(I1-I4)/Vdd/f-C_{12}$$

or alternatively $$C_{10}=(I1/2-I2/2+I3/2-I4)/Vdd/f$$

This is calculated by making the following approximation.

$$C_{stray}=C_{stray4}$$

In the same way, the value of the capacitance $C_{20}$ is obtained.

$$C_{20}=(I2-I4)/Vdd/f-C_{12}$$

or alternatively $$C_{20}=(-I1/2+I2/2+I3/2-I4)/Vdd/f$$

Figure 6:
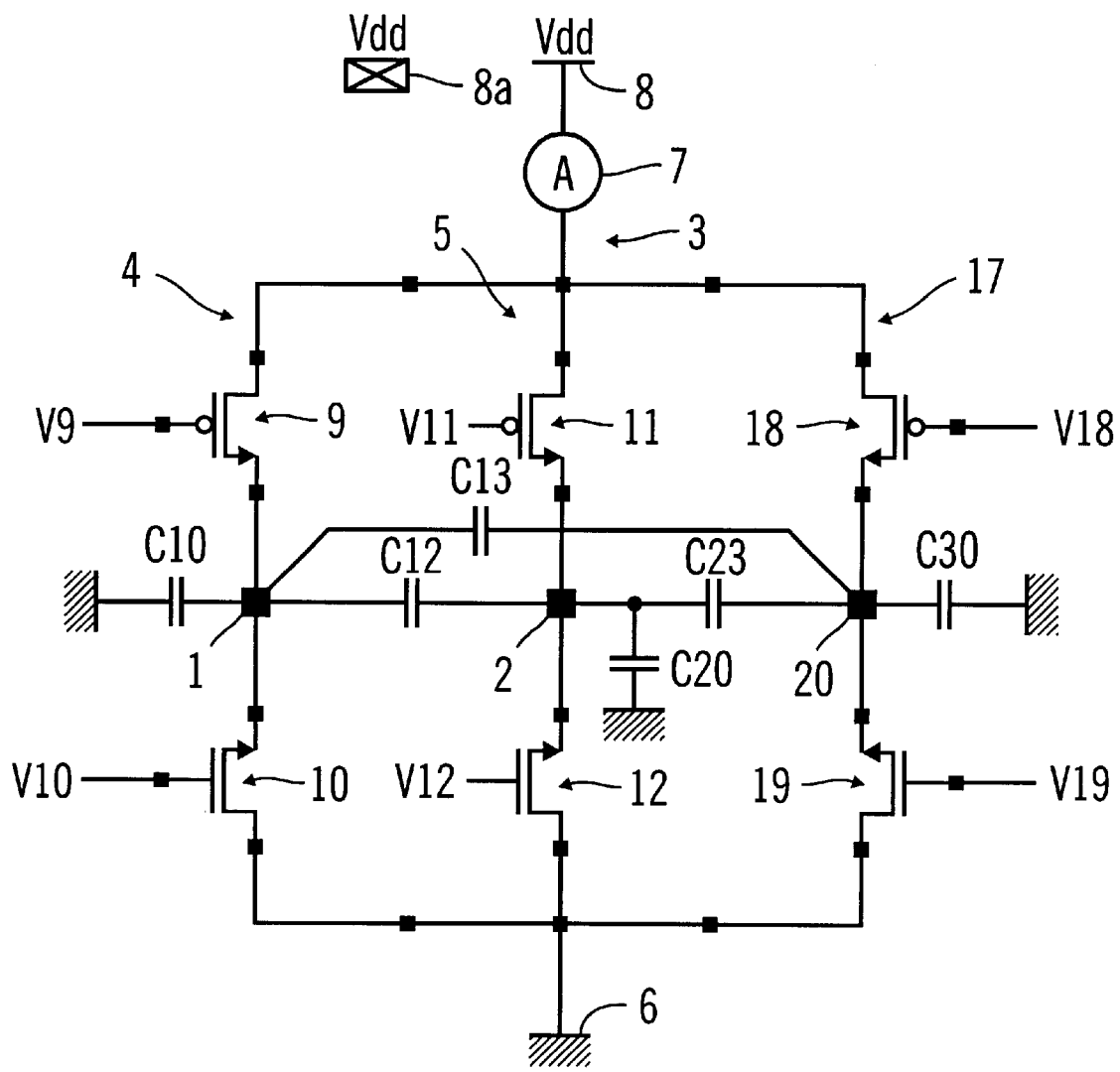
FIG. 6 is a diagram of a test structure according to a third embodiment of the present invention.

As shown in FIG. 6, this test structure can also be adapted for measuring the capacitances existing between three metallized lines of an integrated circuit. A three-branch test structure is then used, with the third branch 17 being identical to the first and second branches 4 and 5 and the common point between its two transistors 18 and 19 being connected to a third metallized line 20. To make it easier to understand the operation of this test structure, thin lines have been used to represent the various capacitances between lines and between lines and ground (e.g., capacitance $C_{13}$ is between the first and third metallized lines and capacitance $C_{30}$ is between the third metallized line and ground).

Figure 7:
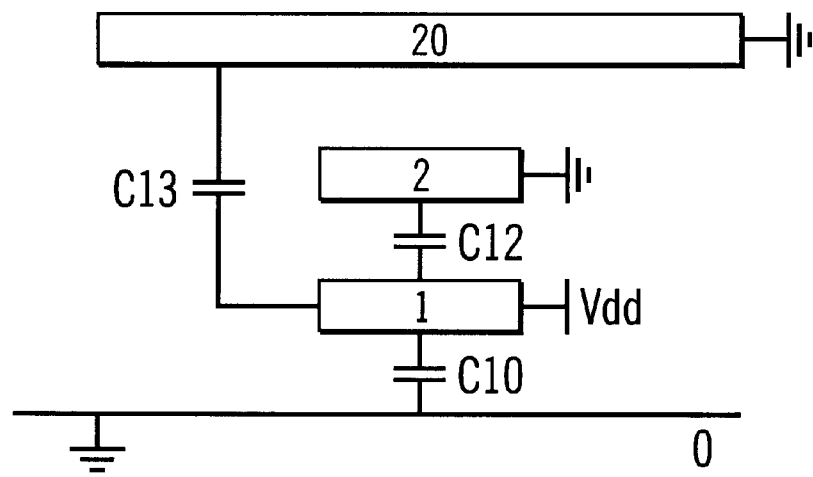
FIGS. 7 through 9 are diagrams demonstrating the use of the test structure of FIG. 6.
Figure 8:
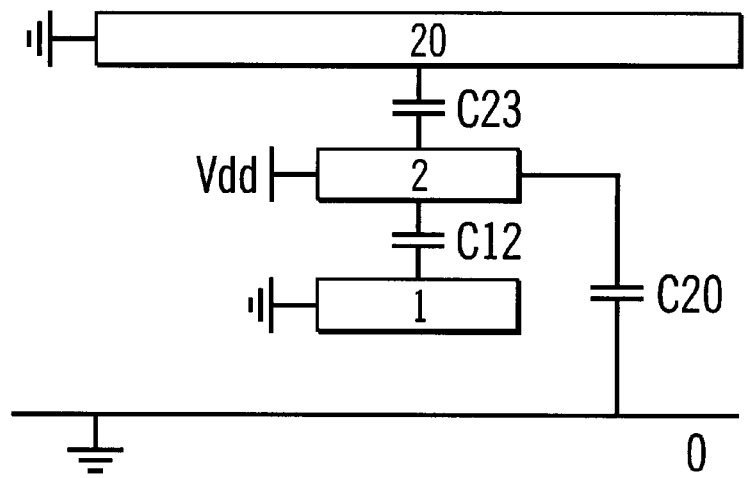
Figure 9:
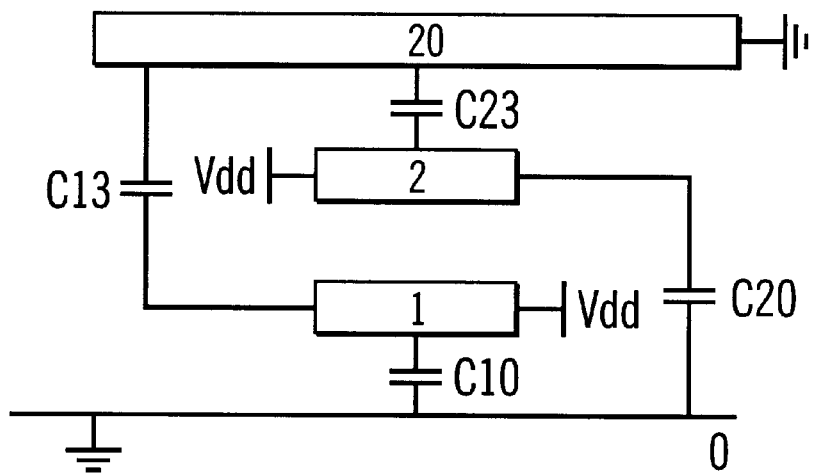

A measurement method for such a test structure is illustrated in FIGS. 7 through 9. FIG. 7 shows the first metallized line 1 having the voltage Vdd applied to it and the other metallized lines are grounded by driving the transistors 9 through 12, 18, and 19 in a suitable way (as described above with reference to FIG. 1). The current that is measured by the current-measuring means 7 then satisfies the following equation.

$$I1=(C_{12}+C_{10}+C_{13}+C_{stray4})\times Vdd\times f$$

Next, as shown in FIG. 8, the voltage Vdd is applied to the second metallized line and a zero voltage is applied to the other metallized lines. The current I2 is measured and satisfies the following equation.

$$I2=(C_{12}+C_{20}+C_{23}+C_{stray5})\times Vdd\times f$$

As shown in FIG. 9, the voltage Vdd is then applied to the first and second metallized lines while the third metallized line is kept at a zero voltage. The current I3 is measured and satisfies the following equation.

$$I3=(C_{10}+C_{20}+C_{23}+C_{13}+C_{stray4}+C_{stray5})\times Vdd\times f$$

Then, the following calculation can be made.

$$C_{12}=\frac{I1+I2-I3}{2\times Vdd\times f}$$

Similarly, the capacitances $C_{13}$ and $C_{23}$ can be calculated by taking three other measurements with the third metallized line at the voltage Vdd and the other two grounded, the second and third metallized lines at the voltage Vdd and the first metallized line grounded, and the first and third metallized lines at the voltage Vdd and the second metallized line grounded. If it is also desired to ascertain the capacitances between the metallized lines and ground, it is possible to use a test structure with an additional branch 13 (as described in FIG. 5) to allow an estimation of the value of the stray capacitances of a branch (i.e., by making the assumption that the stray capacitances of the additional branch are equal to the stray capacitances of one of the other branches).

Such a test structure makes it possible to extremely accurately measure the capacitances existing in an integrated circuit, in particular when two metallized lines are parallel, by using the same test structure subjected to different voltages from which the values of the capacitances are deduced using the superposition theorem. The above-described embodiments of the test structure for measuring the capacitances between two and three metallized lines can easily be further adapted for measuring the capacitances between a greater number of metallized lines by using an equal number of branches.

By knowing the capacitance between two metallized lines, it becomes possible to deduce the distance between the lines because the product of the capacitance times the separation distance is equal to the product of the permitivity of the dielectric times the area of the two lines facing each other. Thus, the value of the thickness of the dielectric separating two metallized lines can be obtained more accurately. However, when MOS transistors close, a charge-injection phenomenon occurs due to the discharging of the capacitances between the gate and the source and between the gate and the drain of the transistor to the current-measuring means, which therefore sees a current slightly weaker than is obtained by modeling because of this return to the supply terminal.

The real current measured is assumed to satisfy the following equation.

$$I_R=(C_{Strayeff}+C)\times Vdd\times f$$

$C_{strayeff}$ making it possible to estimate the stray capacitances and being an increasing function of the value of the capacitance C and a decreasing function of the rise time of the drive voltage at the gate of a transistor. In order to take the measurement, it is desirable to increase the rise time of the non-overlapping signals, so the frequency must decrease even if the gain suffers as a result. This is because the more the rise time τ increases, the more the increase in the derivative, which is given by:

$$\frac{\partial C_{stray.eff}}{\partial C}$$

For example, with τ=100 ns and C=10 fF, $C_{stayeff}$=3.50 can be found. For C=20 fF, $C_{strayeff}$=3.51 is found instead of 3.50, which gives a resolution of 0.01 fF. However, for f=100 MHz and τ=1 ns, for C=10 fF, $C_{strayeff}$=4.2, and for C=20 fF, $C_{strayeff}$=4.3. By subtracting, a 0.1 fF discrepancy can be obtained, which limits the resolution.

Accordingly, the present invention provides a test structure that allows the capacitances to be extremely accurately measured. Thus, it is possible to measure the capacitance between superposed or juxtaposed lines, and to deduce from this the electric permitivity of a dielectric, the distance, height, or width between the lines, and the dispersion in dimensions between various semiconductor circuit wafers, in order to make it possible to guarantee stability in the performance of the integrated circuits for the end user.

Figure 10:
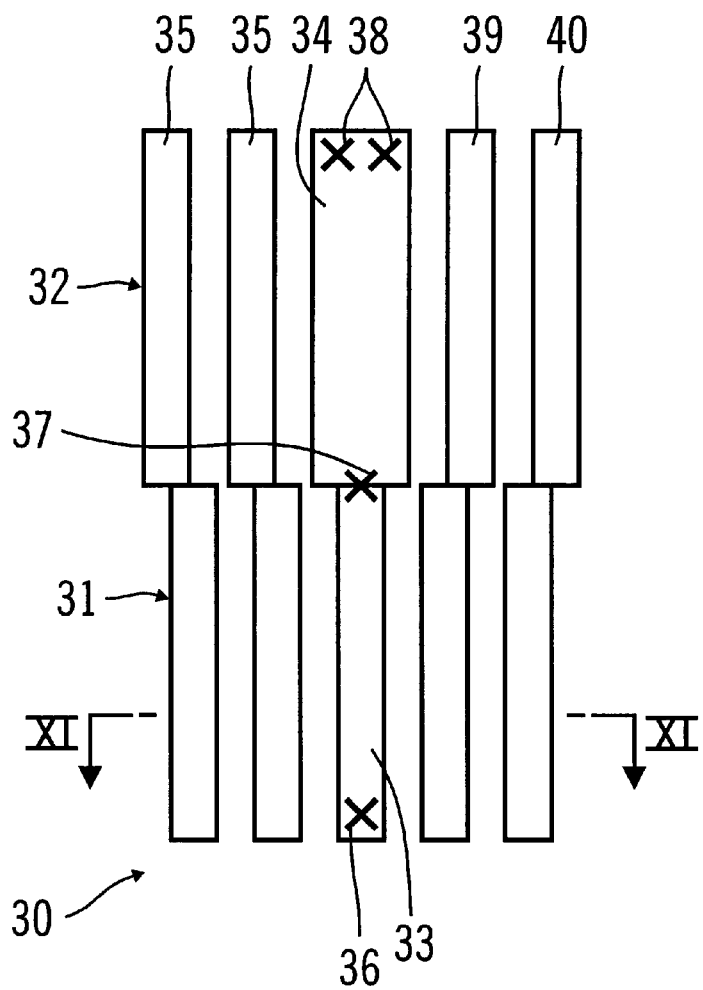
FIG. 10 is a diagram of a test structure according to a fourth embodiment of the present invention.

FIG. 10 shows a test structure according to a fourth embodiment of the present invention. As shown, the test structure 30 includes a first part 31 and a second part 32. The first part 31 is composed of multiple line portions of equal length, width, and height or thickness, with a portion 33 being arranged substantially at the center and being connected to a corresponding portion of the second part 32. The second part 32 includes a central portion 34 and lateral portions 35. The lateral portions 35 have dimensions equal to portion 33, and the central portion 34 is of equal length but greater width than portion 33.

The width of portion 33 is denoted $W_1$, the width of portion 34 is denoted $W_2$, their height is denoted H, their width is denoted L, and their resistance per unit length is denoted ρ. Multiple measurement points are provided on the portions 33 and 34, with one measurement point 36 being at the free end of portion 33, one measurement point 37 being common to the portions 33 and 34, and two measurement points 38 being at the free end of portion 34. This makes it possible to take voltage and current measurements at points 36, 37, and 38 to measure the resistance $R_1$ of portion 33 and the resistance $R_2$ of portion 34.

During fabrication, the line portions suffer small width variations ΔW that can affect their electrical characteristics, so it is desirable to determine such variations with accuracy.

$$R_1=\rho\times L/H/(W_1+\Delta W) \text{ and}$$

$$R_2=\rho\times L/H/(W_2+\Delta W)$$

The term ρ is constant and known because it depends on the material used to produce the portions 33 and 34. The length L is also known, either theoretically or by measurement with sufficient accuracy because the length L is much greater than both the fabrication differences and measurement inaccuracies (e.g., due to the optical measurement process). Further, $W_1$ and $W_2$ are the theoretical widths of the portions 33 and 34 that were set down during fabrication, and the terms ΔW and H are unknown.

By solving these two equations with two unknowns, the height H of the portions is obtained.

$$H=\rho\times(L_2/R_2-L_1/R_1)/(W_2-W_1)$$

From this, the following is deduced.

$$\Delta W=\rho\times L_1/H/R_1-W_2$$

Thus, the height or thickness of a portion of the metallized lines is known, along with its real thickness, and this proves to be very useful in the case of portions with a very small width (e.g., 0.3 μm) for which optical measuring instruments are not sufficiently accurate.

Figure 11:
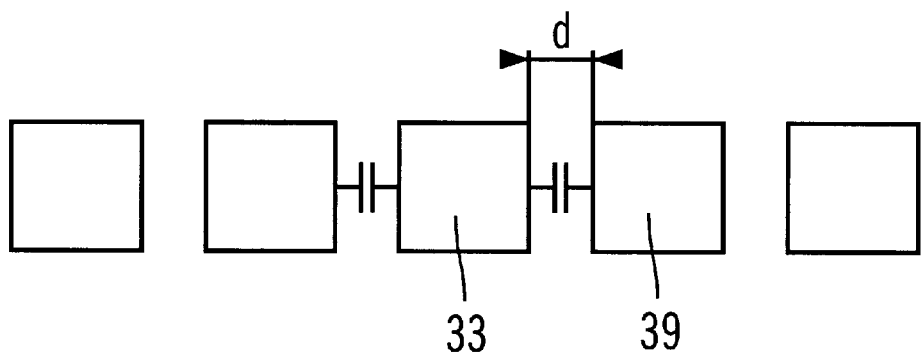
FIG. 11 is a sectional view taken on line XI—XI of FIG. 10.

With reference to FIG. 11, an attempt will now be made to obtain the distance d separating two adjacent line portions in the same metallization plane. The capacitance C between the line portion 33 and the adjacent line portion 39 is measured to give the following.

$$C = \epsilon \times H \times L / d$$

$\epsilon$ being the permittivity of the dielectric lying between the portions 33 and 39. The permittivity $\epsilon$ is constant and known because it depends on the material so the following is calculated.

$$d = \epsilon \times H \times L / C_1$$

For better accuracy, the height H can be corrected with the height of weakly conducting layers arranged under and/or on the metal forming the line portion. These layers (e.g., of titanium nitride or titanium aluminum alloy) can advantageously be taken into account during the calculation of the distance d to give the following.

$$H_{TOTAL} = H_1 + H_{TiN} + H_{T2A13}$$

On the other hand, the possible bulging of these layers can be ignored because it does not affect the value of the capacitance. By knowing the distance between two adjacent line portions and the real width of the lines, the fabrication pitch p can be deduced using the following equation.

$$p = d + W_1 + \Delta W$$

Thus, by virtue of the increase in the accuracy with which the capacitances and the line widths are measured, the accuracy of the pitch measurement increased.

The test structure of the present invention can also be used to measure the thickness of a dielectric layer that separates two metallization planes. Such a measurement is conventionally carried out by using a capacitance meter that has limited resolution, and this makes it necessary to provide capacitors with very large dimensions (e.g., 2000×500 μm). This is expensive and again inaccurate because over such an area there is a risk that the thickness of dielectric will exhibit variations. Furthermore, a capacitor with such dimensions is very far from the integration density of the rest of the circuit.

Figure 12:
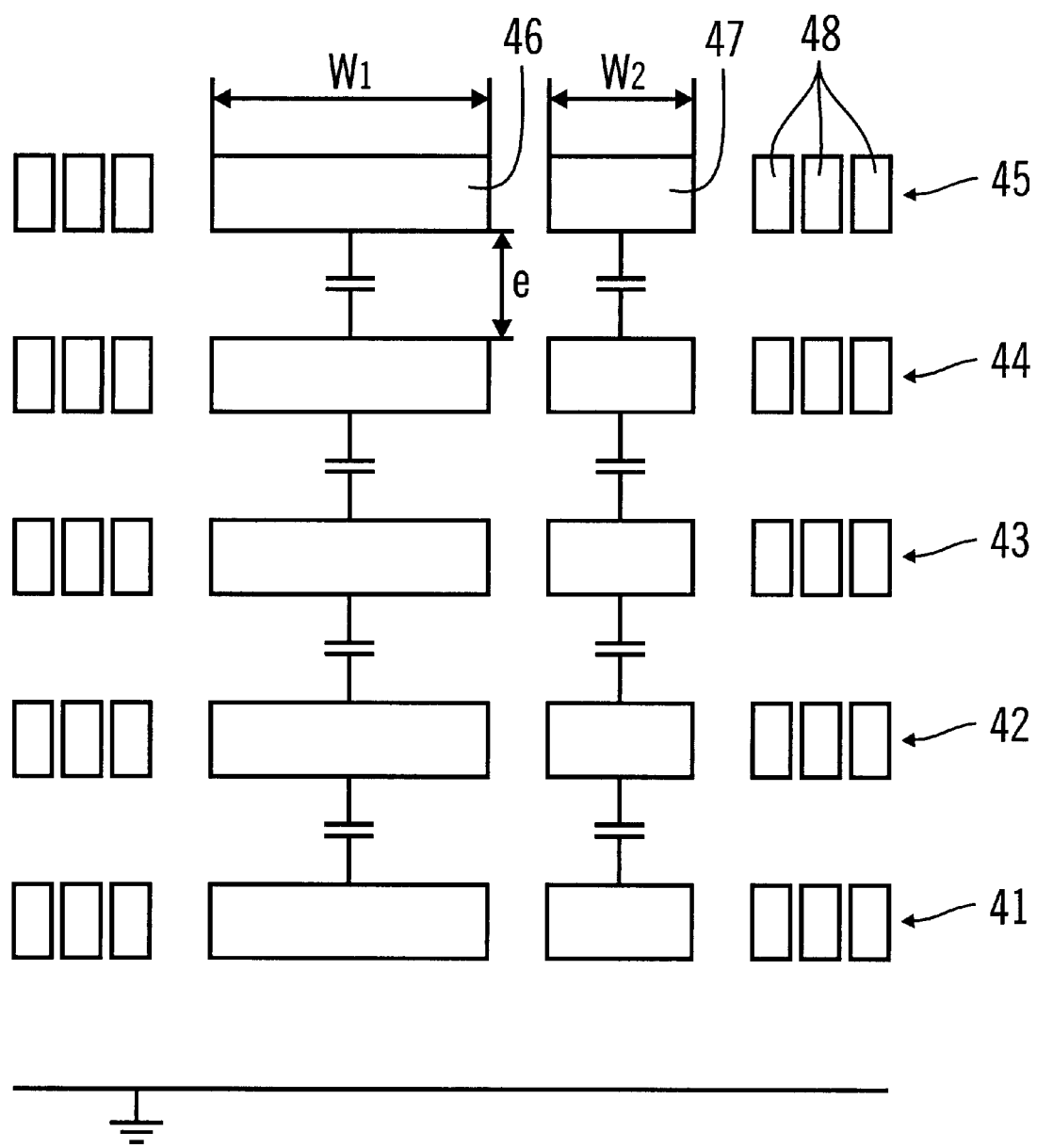
FIG. 12 is a cross-sectional view of a test structure according to a fifth embodiment of the present invention.

In order to overcome these drawbacks, a test structure according to a fifth embodiment of the present invention is provided, as shown in FIG. 12. The test structure includes multiple conductor planes 41 through 45, and each conductor plane includes a line portion 46 of width $W_{46}$ and a line portion 47 of width $W_{47}$. The line portions 46 and 47 are surrounded by other line portions 48 whose presence ensures uniform fabrication, in particular during possible steps for polishing the surface of the metallization planes.

Direct measurement of the capacitance between two portions 46 of two adjacent metallization planes (e.g., 44 and 45) gives a capacitance C that can be modeled by the following equation.

$$C = C_{edge} + W \times L \times \epsilon / e$$

with $C_{edge}$ being a term that is constant regardless of the width of the line portion and corresponding to the field lines that pass over the sides of the line portions 46, $\epsilon$ being the permittivity of the dielectric separating the two metallization planes, L being the length of the line portions 46, and e being the thickness of the dielectric separating the two metallization planes. For an accurate measurement, the width and length of the line portions 46 will be identical regardless of the metallization plane, and the same will be true with regard to the line portions 47. Additionally, the length of the line portions 46 is equal to that of the line portions 47.

In order to extract the term $C_{edge}$, two measurements are actually taken: one on the line portions 46 and the other on the line portions 47. Thus, two equations are obtained to make it possible to eliminate the term $C_{edge}$.

$$C_{46} = C_{edge} + W_{46} \times L \times \epsilon / e \text{ and}$$

$$C_{47} = C_{edge} + W_{47} \times L \times \epsilon / e$$

Therefore, the following equation can be calculated.

$$e = \epsilon \times L \times (W_{46} - W_{47}) / (C_{46} - C_{47})$$

Thus, accurate measurement of the capacitances using the test structure of the present invention allows an accurate measurement of the thickness of the dielectric separating two conductor planes. This is a thickness that must be known to monitor the fabrication process.

Accordingly, the present invention allows an extremely accurate measurement of the capacitances to be obtained, in particular in an integrated circuit. Such accurate knowledge of the capacitances makes it possible to more accurately ascertain the dimensions, heights, thicknesses, and widths of the elements of the circuit that is equipped with the test structure of the present invention.

The test structure of the present invention can be applied to integrated or non-integrated circuits. For example, the test structure can be used with any circuit that has a stack of alternating dielectric layers (e.g., silicon oxide layers) and conducting layers (e.g., metallized layers) arranged on a substrate, with the conducting layers having conducting lines separated by a dielectric layer.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method for testing a circuit of the type having a plurality of metallization planes separated by dielectric layers, with each metallization plane being provided with metallized lines, said method comprising the steps of:

calculating the capacitance between a first line and a second line of the circuit by:
measuring a first current that charges the first line to a first predetermined voltage while the second line is kept at a second predetermined voltage, which is different than the first predetermined voltage;
measuring a second current that charges the second line to the first predetermined voltage while the first line is kept at the second predetermined voltage; and measuring a third current that charges the first and second lines to the first predetermined voltage, wherein the measuring steps are performed using a single current-measuring means, and a branch having two switches in series is associated with each of the first and second lines.

2. The method as defined in claim 1, further comprising the step of calculating the capacitance between the first line and a third line of the circuit by:

measuring a fourth current that charges the third line to the first predetermined voltage while the first and second lines are kept at the second predetermined voltage; and measuring a fifth current that charges the first and third lines to the first predetermined voltage while the second line is kept at the second predetermined voltage.

3. The method as defined in claim 1, further comprising the step of calculating the height of the metal forming one of the lines by measuring the resistance $R_1$ between two points of a portion with theoretical width $W_1$, the resistance $R_2$ between two points of another line portion with theoretical width $W_2$, which is different from $W_1$, the real width of a line portion differing from the theoretical width by a constant difference $\Delta W$ regardless of the theoretical width, and by eliminating the unknown term $\Delta W$ from the equations: $R_1 = \rho \times L_1/H/(W_1 + \Delta W)$ and $R_2 = \rho \times L_2/H/(W_2 + \Delta W)$, with $\rho$ being the known resistance constant in ohm/meter associated with metal used and L being the length of the portion in question, to give $H = \rho \times (L_2/R_2 - L_1/R_1)/(W_2 - W_1)$.

4. The method as defined in claim 1, further comprising the step of calculating the fabrication pitch p of the lines using $p = W_1 + \Delta W + d$ and $\Delta W = \rho \times L_1/H/R - W_2$.

5. The method as defined in claim 1, further comprising the step of calculating the thickness d of the dielectric separating the line from an adjacent line by using $d = \epsilon \times L_1 \times H/C_1$, $\epsilon$ being permittivity of the material of the dielectric layer and $C_1$ being the capacitance between the first line portion and the neighboring line from which the first portion is separated by the thickness e of the dielectric.

6. The method as defined in claim 2, wherein before the step of calculating the thickness d, the height or heights of weakly conducting layers arranged below and/or above the line are added to the height H, so that the total height is taken into account in the calculation of the thickness d.

7. The method as defined in claim 1, further comprising the step of calculating capacitance between each line and a terminal that is at one of the first and second predetermined voltages by measuring a fourth current that charges a point, which is common to two switches of an additional branch that is independent of the lines, to the first predetermined voltage, the fourth current being proportional to the stray capacitance of the additional branch.

8. The method as defined in claim 7, further comprising the step of calculating the capacitance between the first line and a third line of the circuit by:

measuring a fifth current that charges the third line to the first predetermined voltage while the first and second lines are kept at the second predetermined voltage; and measuring a sixth current that charges the first and third lines to the first predetermined voltage while the second line is kept at the second predetermined voltage.

9. The method as defined in claim 7, further comprising the steps of:

measuring a capacitance $C_1$ between the two line portions with length L and width $W_1$ in two adjacent metallization planes, the measured capacitance being equal to $C_1 = \epsilon \times L \times W_1/e + C_{edge}$, with $C_{edge}$ being due to edge effects that are constant regardless of the width of the line portion;

measuring a capacitance $C_2$ between two line portions with the same length L, but with width $W_2$, which is different from $W_1$ and in the same metallization plane, the measured capacitance being equal to $C_2 = \times L \times W_2/e + C_{edge}$;

subtracting to eliminate the term $C_{edge}$ and give $C_1 - C_2 = \epsilon \times L \times (W_1 - W_2)/e$; and deducing the value of the thickness e of the dielectric layer separating two adjacent metallization planes using $e = \epsilon \times L \times (W_1 - W_2)/(C_1 - C_2)$.

* * * * *